(12) United States Patent
Burleson et al.

(10) Patent No.: US 7,529,118 B2
(45) Date of Patent: May 5, 2009

(54) GENERALIZED INTERLOCKED REGISTER CELL (GICE)

(75) Inventors: Wayne Burleson, Shutesbury, MA (US); Shubhendu S. Mukherjee, Framingham, MA (US); Vinod Ambrose, Northboro, MA (US); Daniel E. Holcomb, Watertown, MA (US)

(73) Assignee: Intel Corporation, Santa Clara, CA (US)

( * ) Notice: Subject to any disclaimer, the term of this patent is extended or adjusted under 35 U.S.C. 154(b) by 200 days.

(21) Appl. No.: 11/729,197

(22) Filed: Mar. 28, 2007

(65) Prior Publication Data

US 2008/0239793 A1 Oct. 2, 2008

(51) Int. Cl.
*G11C 11/00* (2006.01)
(52) U.S. Cl. .................... 365/156; 365/154
(58) Field of Classification Search ............ 365/154, 365/156, 173, 188
See application file for complete search history.

(56) References Cited

U.S. PATENT DOCUMENTS 6,058,041 A * 5/2000 Golke et al. ............. 365/156
6,133,747 A * 10/2000 Cameron ................. 326/9
6,583,470 B1 * 6/2003 Maki et al. ............. 257/349

OTHER PUBLICATIONS

R. Velazco et al., "Two CMOS Memory Cells Suitable for the Design of SEU-Tolerant VLSI Circuits", IEEE Trans. on Nuclear Science, vol. 41, No. 6, Dec. 1994, pp. 2229-2234.
T. Calin et al., "Upset Hardened Memory Design for Submicron CMPS Technology", IEEE Trans. on Nuclear Science, vol. 43, No. 6, Dec. 1996, pp. 2874-2878.
F. Faccio et al., "Single Event Effects in Status and Dynamic Registers in a 0.25 μm CMOS Technolody", IEEE Trans. on Nuclear Science, vol. 46, No. 6, Dec. 1999, pp. 1434-1439.
M. Myjak et al., "Enhanced Fault-Tolerant CMOS Memory Elements", The 47th IEEE International Midwest Symposium on Circuits and Systems, 2004, pp. I-453-I-456.
P. Hazucha et al., "Measurements and Analysis of SER-Tolerant Latch in a 90-nm Dual-VT CMOS Process", IEEE Jrnl Solid-State Circuits, vol. 39, No. 9, Sep. 2004, pp. 1536-1543.

* cited by examiner

*Primary Examiner*—Tuan T Nguyen
*Assistant Examiner*—Hien N Nguyen
(74) *Attorney, Agent, or Firm*—Matthew C. Fagan (57) ABSTRACT

A memory element which includes a family of fault-tolerant storage elements using complementary metal-oxide-semiconductor (CMOS) technology is provided. The memory element provides arbitrary levels of redundancy, allowing the tolerance of multiple single event upsets due to particle hits. The memory element may be used in memory arrays such as caches and register files, and clocked registers and latches found in data path and control structures.

14 Claims, 7 Drawing Sheets

GENERALIZED INTERLOCKED REGISTER CELL (GICE)

FIELD

This disclosure relates to protection of a storage cell from soft errors and in particular to protection of a storage cell from a simultaneous strike to two or more internal nodes.

BACKGROUND

A memory element, also referred to as a storage cell stores one bit. The single bit storage cell has two stable states (logical 0 and logical 1). Typically, a memory element in a Static Random Access Memory (SRAM) includes four transistors that form two cross-coupled inverters with each inverter having a p-channel metal-oxide-semiconductor field-effect transistor (PMOS)-transistor and an n-channel metal-oxide-semiconductor field-effect transistor (NMOS)-transistor. Memory cells made of complementary metal-oxide-semiconductor (CMOS) memory elements are prone to errors such as single event upsets that are also referred to as soft errors. A single event upset occurs when a charged particle causes a transient voltage spike which results in a change of state of the memory element. The charged particle may be due to natural radiation that is present in substrate and die packaging or generated in the substrate by cosmic rays.

A Dual interlocked Storage Cell (DICE) provides protection from soft errors through the addition of redundant transistors to the memory element. The DICE is described in "Upset hardened memory design for submicron CMOS technology" by Calin, T.; Nicolaidis, M.; Velazco, R.; Nuclear Science, IEEE Transactions, Volume 43, Issue 6, Part 1, December 1996 Page(s):2874-2878.

The DICE employs twice the number of transistors as compared to a traditional SRAM storage cell. Instead of the four transistors in a traditional SRAM storage cell, eight transistors form four inverters interlocked together so that the P-transistor and the N-transistor in each inverter are controlled by separate internal nodes. The state (logical 0 or logical 1) of the single bit storage cell is stored by the four inverters as two pairs of complementary values: 1010 or 0101. A stored value of 0101 represents logical 0 and a stored value of 1010 represents logical 1. Each of the internal nodes is connected to a pair of NMOS and PMOS transistors and also controls the operation of another pair of NMOS and PMOS transistors.

After a particle strike on a first internal node, the first internal node transitions to logical 1, if initially logical 0. The first internal node transitions to logical 0, if initially logical 1. After the transient pulse generated by the particle strike disappears, the internal node that controls the operation of the pair of NMOS and PMOS transistors coupled to the first node restores the state of the first node.

However, if a single particle or multiple particles simultaneously strike two or more internal nodes, the DICE may not recover, dependent on which of the internal nodes are struck. The vulnerable combination of internal nodes is dependent upon the stored state of the memory element, due to the asymmetry of the inverters. For example, if the nodes numbered 1-4 store 1010 or 0101 respectively, if nodes 1 and 2 which store different values (10 or 10) are struck, the DICE may recover. However, if nodes 1 and 3 which store the same value (00 or 11) are struck, the DICE will not recover.

Furthermore, although a DICE itself can recover from a single strike, a glitch may appear at the output of the DICE, which in turn may be captured by subsequent DICE, for example, in an SRAM.

BRIEF DESCRIPTION OF THE DRAWINGS

Features of embodiments of the claimed subject matter will become apparent as the following detailed description proceeds, and upon reference to the drawings, in which like numerals depict like parts, and in which:

Although the following Detailed Description will proceed with reference being made to illustrative embodiments of the claimed subject matter, many alternatives, modifications, and variations thereof will be apparent to those skilled in the art. Accordingly, it is intended that the claimed subject matter be viewed broadly, and be defined only as set forth in the accompanying claims.

DETAILED DESCRIPTION

An embodiment of the present invention provides a Generalized Interlocked Memory Cell (GICE) which includes a family of fault-tolerant storage elements using complementary metal-oxide-semiconductor (CMOS) technology. An embodiment of the GICE provides arbitrary levels of redundancy, allowing the tolerance of multiple single event upsets due to particle hits. An embodiment of the GICE may be used in memory arrays such as caches and register files, and clocked registers and latches found in data path and control structures.

An embodiment of the GICE includes a set of interlocked monostable elements, each including an n-channel metal-oxide-semiconductor field-effect (NMOS) transistor and a p-channel metal-oxide-semiconductor field-effect (PMOS) transistor. The set of monostable elements may be configured in different ways and combined with access transistors to provide arbitrary levels of redundancy. The techniques may be combined with circuit-level methods such as transistor sizing, threshold voltage tuning and cell layout to trade off reliability versus size, energy and performance.

Embodiments of the GICE use additional nodes and connections between nodes to allow the tolerance of multiple single event upsets and to protect against stronger hits (that is, magnitude of the charge introduced by the charged particle) than the Dual interlocked Storage Cell (DICE) described in "Upset hardened memory design for submicron CMOS technology" by Calin, T.; Nicolaidis, M.; Velazco, R.; Nuclear Science, IEEE Transactions, Volume 43, Issue 6, Part 1, December 1996 Page(s):2874-2878.

The GICE increases the number of memory elements from four in the DICE to at least six. Each memory element includes two transistors, one NMOS-transistor and one PMOS-transistor; however these transistors are not connected in the conventional inverter format as in the DICE. Instead, the transistors are connected in a loop allowing only a single stable state to be retained at a given time. The storage element provides the functionality of a monostable element, that is, a circuit having two states, with only one of the states being stable. The stable state is the state in which the input to the NMOS (gate of the NMOS transistor) is a logical 1 and the input to the PMOS (gate of the PMOS transistor) is a logical 0. Thus, the state in which each transistor is ON is reinforced. However, the opposite state, in which both transistors are OFF, is not stable.

By configuring groups of monostable elements, various levels of redundancy can be achieved in order to protect a memory cell from a simultaneous charged particle strike by one or more particles to two or more internal nodes in the memory cell.

Figure 1:
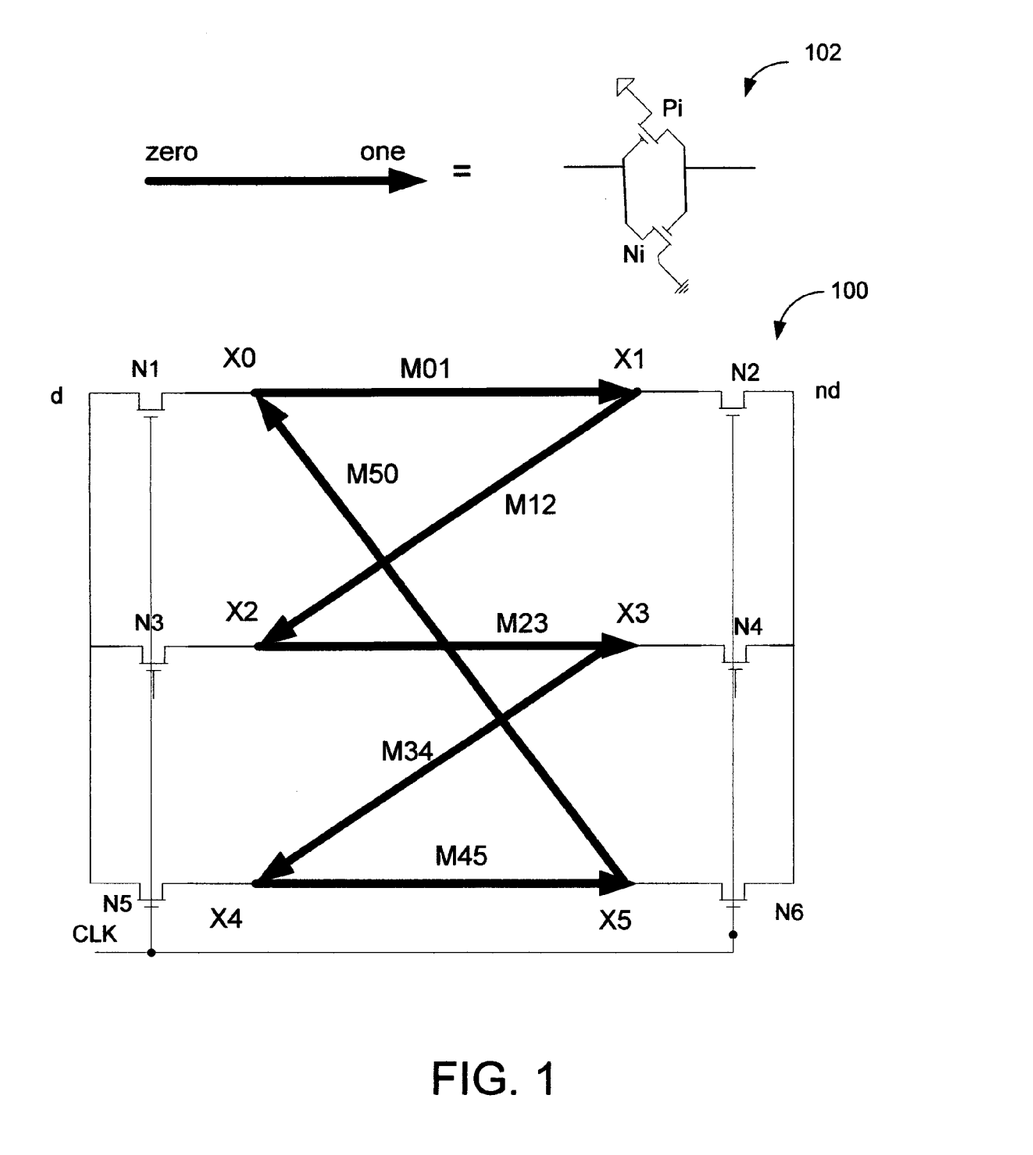
FIG. 1 is a circuit diagram illustrating an embodiment of a triply interconnected cell (TICE) using a GICE method according to the principles of the present invention.

FIG. 1 is a circuit diagram illustrating an embodiment of a triply interconnected cell (TICE) 100 using the GICE method according to the principles of the present invention. For ease of understanding, instead of providing a circuit representation of each monostable element in the TICE cell, each monostable element 102 is represented as an arrow with the head labeled ONE and the tail labeled ZERO, indicating the logical value of the head and the tail in the stable state. The monostable element circuit 102 represented by the arrow is shown in FIG. 1.

Each monostable element 102 is a storage node. As shown, the monostable element 102 includes two devices, a PMOS (P-type) device labeled Pi and an NMOS (N-type) device labeled Ni. The gate of the P-type device Pi is coupled to the source of the N-type device Ni. The drain of Pi is coupled to the gate of Ni. The source of Pi is coupled to the supply voltage Vcc and the drain of Ni is coupled to Vdd (ground). Thus, the monostable element 102 is stable when there is a logical 0 (ZERO) at the gate of Pi and a logical 1 (ONE) at the gate of Ni.

The TICE 100 includes six monostable elements 102 each having one P-type device and one N-type device, with each monostable element 102 represented by an arrow indicating the stable state, that is, with logical 0 (ZERO) at the tail and logical 1 (ONE) at the head. The monostable elements 102 represented by arrows labeled M01, M12, M23, M34, M45, and M50 are coupled to provide six nodes labeled X0-X5.

With six nodes and two devices (storage transistors) per monostable element 102, the TICE has a total of twelve storage transistors. The TICE also has six access devices (transistors) labeled N1, N2, N3, N4, N5, and N6. Thus, the memory cell has a total of 18 transistors, 12 storage transistors and six access transistors.

The storage transistors are configured such that the TICE 100 has two coherent states—010101 (logical 0) and 101010 (logical 1) based on the logical values on each of the six nodes (X0-X5). In the first coherent state, nodes X0, X2, X4 store logical 0 and nodes X1, X3, X5 store logical 1. Thus, nodes X0-X5 store the value 010101 which represents a logical 0 for the TICE 100. In the second coherent state, X0, X2 and X4 store logical '1' and nodes X1, X3 and X5 store logical 0. Thus nodes X0-X5 store the value 101010 which represents a logical 1 for the TICE 100.

The TICE resists a single particle strike to one node. For example, if the TICE is in the first coherent state, the TICE stores 101010 (logical 1). Monostable element M01 is in a stable state with logical 0 at node X0 and logical 1 at node X1. A transient pulse generated by a charged particle strike to node X0 results in node X0 collecting charge and transitioning from logical 0 to a logical 1.

As node X0 transitions to logical 1, monostable element M50 is turned on because there is a logical 1 at the tail (node X5) and a logical 0 at the head (node X0). Thus, the transient pulse temporarily forces node X5 from a logical 1 to an ambiguous state. Nodes X1 and X4 are not driven from their initial states and thus capacitively preserve their state (remain at the first coherent state logical values).

After the transient pulse at node X0 subsides, nodes X1 and X4 restore the first coherent state. The first coherent state is restored by driving node X0 back to logical 0 via monostable element M01 and node X5 back to logical 1 via monostable element M45.

There are many situations in which one or more particles may strike one, two or more nodes. In contrast to the DICE in which any magnitude charged particle strike to three or more nodes is not tolerated, Simulation Program with Integrated Circuit Emphasis (SPICE) simulations show that the TICE resists strikes to three or more nodes better than the DICE. SPICE is a general purpose analog circuit simulator that may be used to predict circuit behavior.

Figure 2:
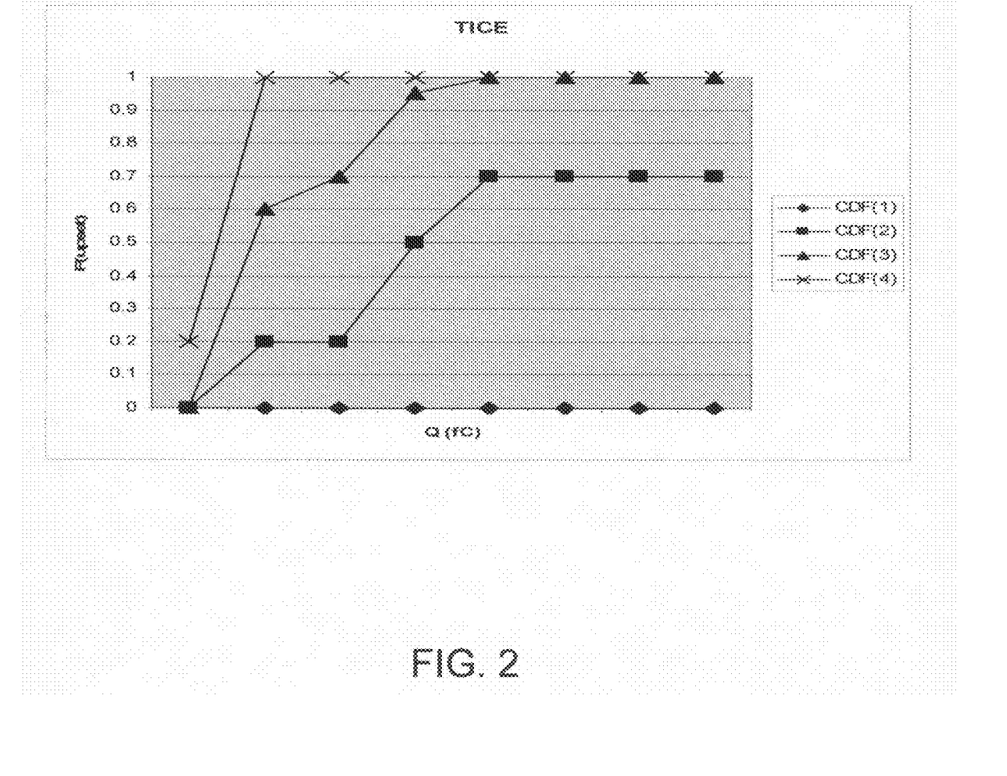
FIG. 2 is a graph illustrating percentage of hits that result in failure based on magnitude of charged particle for a simulation of the TICE shown in FIG. 1.

FIG. 2 is a graph illustrating percentage of hits that result in failure based on magnitude of charged particles for a simulation of the TICE shown in FIG. 1. The X-axis corresponds to the amount of charge (Q) injected into the node(s), that is, the magnitude of the charged particles. The Y-axis corresponds to the percentage of hits that result in failure. The graph provides the results of a SPICE simulation for charged particle hits for a different magnitude of charge to one, two, three or four nodes. These simulations were run across a range of strike charges, locations and timings. As shown, in the case of a charged particle to one node, the TICE always recovers irrespective of the magnitude of the charged particle.

In contrast to the DICE in which a charge to three or four nodes always results in a non-recoverable error, the TICE recovers from some hits to three or four nodes when there is a low magnitude charge. Based on the SPICE simulation results, the TICE resists strikes to two nodes better than the DICE and also resists low magnitude charge particle strikes to three and four nodes.

Figure 3:
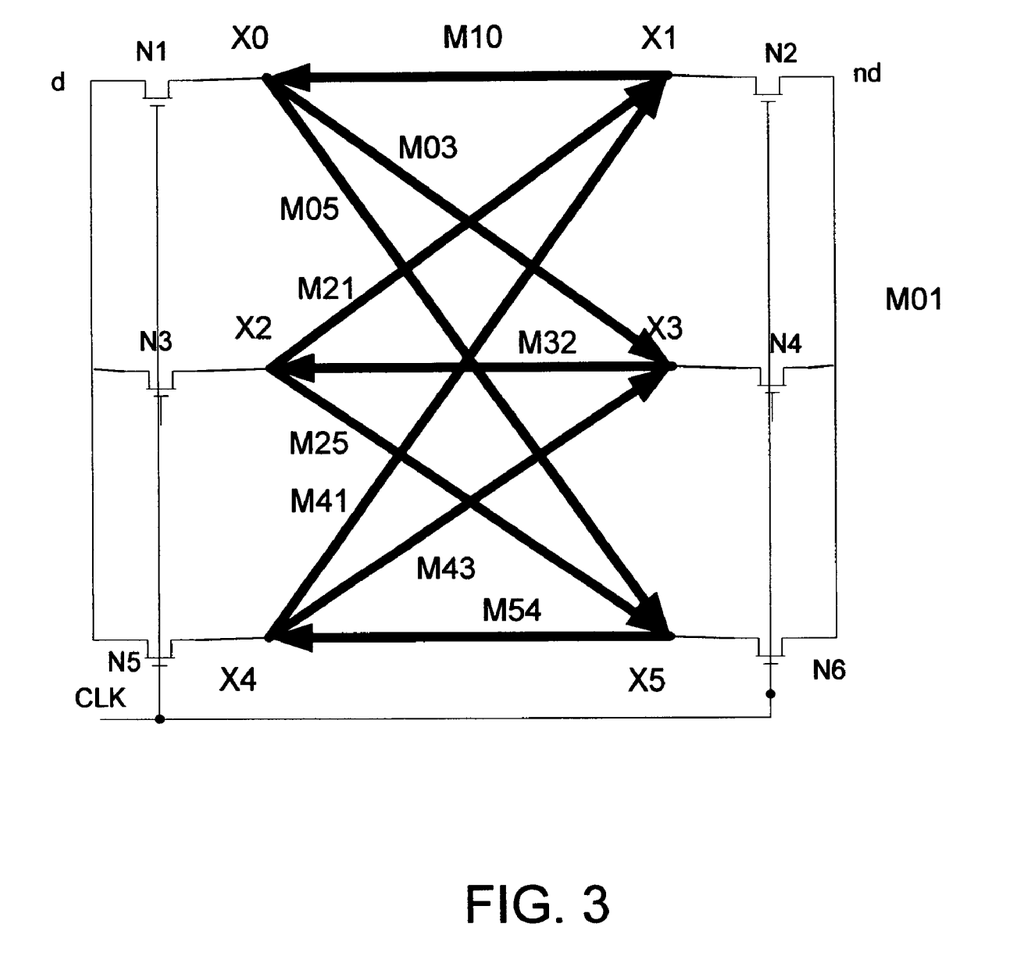
FIG. 3 is a circuit diagram illustrating an embodiment of an triple multiply interconnected cell (TMICE) using the GICE method according to the principles of the present invention.

FIG. 3 is a circuit diagram illustrating an embodiment of a triple multiply interconnected cell (TMICE) 200 using the GICE method according to the principles of the present invention.

As discussed in conjunction with the embodiment shown in FIG. 1, for ease of understanding, instead of providing a circuit representation of each monostable element in the TMICE cell 200, each monostable element is represented as an arrow having a head and a tail.

The TMICE 200 includes nine monostable elements 102 (FIG. 1). Each of the monostable elements 102 includes one P-type device and one N-type device as discussed in conjunction with the TICE 100 described in conjunction with FIG. 1. The TMICE 200 includes the six monostable elements 102 discussed in conjunction with the TICE 100 in FIG. 1 and an additional three monostable elements. The three additional connections between nodes X0-X5 provided by monostable elements M25, M41 and M03 provide stronger immunity to single faults than a DICE memory element.

In an embodiment the P-type device and the N-type device in the monostable element 102 are transistors. The monostable elements 102 labeled M10, M03, M05, M21, M25, M32, M41, M43, M54 are coupled to provide six nodes labeled X0-X5.

With nine monostable elements each having two transistors, the TMICE cell 200 has a total of eighteen storage transistors. The TMICE also has six access transistors labeled N1, N2, N3, N4, N5 and N6. Thus, in the embodiment shown in FIG. 2, the TMICE 200 has a total of 24 transistors, that is, 18 storage transistors and 6 access transistors.

With six nodes (X0-X5), the TMICE 200 has two coherent states based on the logical values at each node (X0-X5)- 010101 (logical 0) and 101010 (logical 1). In the first coherent state, nodes X0, X2, X4 store logical 0 and nodes X1, X3, X5 store logical 1. Thus, nodes X0-X5 store the value 010101 which represent a logical 0 for the TMICE 200. Monostable elements M03, M05, M21, M25, M41 and M43 are ON with a logical 0 at the head and a logical 1 at the tail.

In the second coherent state, X0, X2 and X4 store logical 1 and nodes X1, X3 and X5 store logical 0. Thus nodes X0-X5 store logical 101010 which represent a logical 1 for the TMICE. Nodes X0,X2,X4 store a logical 0 and nodes X1,X3, X5 store a logical 1. Monostable elements M10, M32 and M54 are ON with a logical 0 at the head and a logical 1 at the tail of each monostable element.

The TMICE may recover from a transient pulse due to a charged particle strike to any one of the six nodes X0-X5. For example, while in the second coherent state with X0, X2, X4 storing a logical 1, a transient pulse due to a charged particle strike on node X0 results in the logical 1 stored on node X0 being discharged temporarily through monostable elements M03 and M05 until node X0 is at logical 0. A logical 0 at node X0 results in turning on the P-type device of monostable element M03 and the P-type device of monostable element M05.

Monostable elements M03, M05 try to drive node X3 and node X5 to logical 1. However, node X2 and node X4 have both capacitively stored a logical 1, and continue to drive node X3 and node X5 to a logical 1 via monostable element M32 and monostable element M54. This leads to a temporary contention on node X3 and node X5.

After the transient pulse due to the charged particle strike subsides, node X1 drives node X0 to a logical 1 via the P transistor of monostable element M10. As node X0 is driven to from logical 0 logical 1, monostable element M03 and monostable element M05 are turned off. This eliminates contention on node X3 and node X5, allowing monostable element M32 and monostable element M54 to restore node X3 and node X5 to their coherent state 2 logical level, that is, logical 1. The TMICE 300 has returned to coherent state 2.

The TMICE 200 can recover from simultaneous strikes to two nodes storing the same logical value. For example, the TMICE 200 begins in coherent state 1, with nodes X0, X2, X4 storing a logical 0 and nodes X1, X3, X5 storing a logical 1. A transient pulse caused by one or more charged particle strikes to both node X1 and node X3 discharges the stored logical 1 to logical 0 at both node X1 and node X3. The logical 0 on both node X1 and node X3, turns monostable element M10 and monostable element M32 on. Monostable element M10 tries to drive node X0 to logical 1 while monostable element M03 and monostable element M05 drive X0 to a logical 0, resulting in contention. Monostable element M32 tries to drive node X2 to a logical 1 while monostable element M21 and monostable element M25 are driving it to logical 0, resulting in contention. However, the state of node X4 and node X5 are stored capacitively.

After the transients subside, node X4 drives node X1 and node X3 to a logical 1 again through monostable element M41 and monostable element M43, and node X5 drives node X0 and node X2 to a logical 0 via monostable element M03 and monostable element M05. This allows the TMICE 200 to return to its initial coherent state. Thus, the TMICE 200 can tolerate one or more charged particle strikes on multiple nodes for this combination of nodes storing the same logical value.

Figure 4:
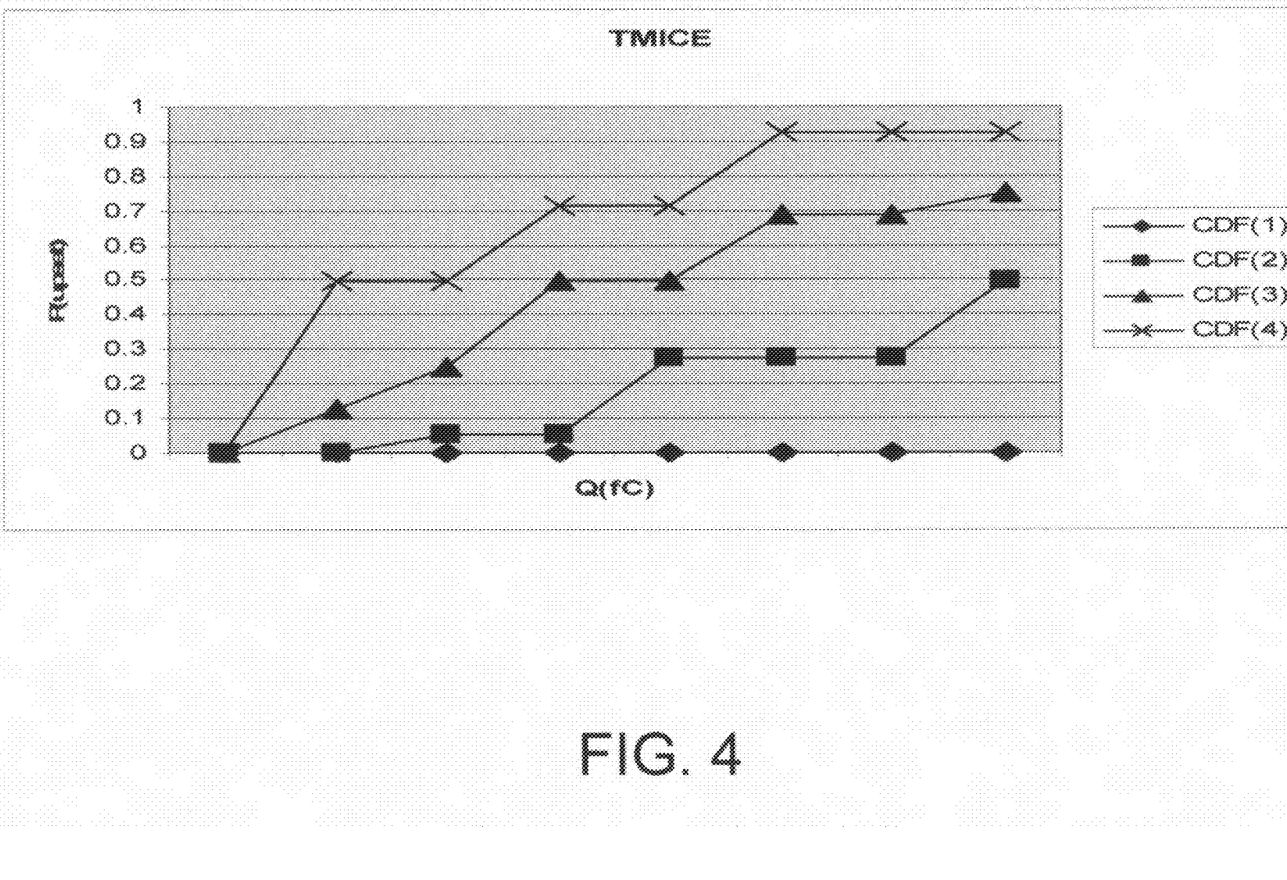
FIG. 4 is a graph illustrating percentage of hits that result in failure based on magnitude of charged particle for a simulation of the TMICE shown in FIG. 3.

FIG. 4 is a graph illustrating percentage of hits that result in failure based on magnitude of charged particle for a simulation of the TMICE shown in FIG. 3.

The X-axis corresponds to the amount of charge (Q) injected into the node(s), that is, the magnitude of the charged particles. The Y-axis corresponds to the percentage of hits that result in failure. The graph provides the results of a SPICE simulation for charged particle hits for a different magnitude of charge to one, two, three or four nodes in the TMICE circuit. As shown, in the case of a charged particle to one node, the TICE always recovers irrespective of the magnitude of the charged particle.

In contrast to the TICE discussed in conjunction with FIG. 1 and FIG. 2 in which a charge to three or four nodes may result in a non-recoverable error dependent on the magnitude of the charged particle, the TMICE recovers from a greater percentage of hits to two nodes for a higher magnitude charge than the TICE.

Also, all of the hits to three or four nodes in the simulation did not result in failure in comparison the TICE simulation results. Based on the SPICE simulation results, the TICE resists strikes to multiple nodes better than the TMICE and also resists charge particle strikes to three and four nodes.

Figure 5:
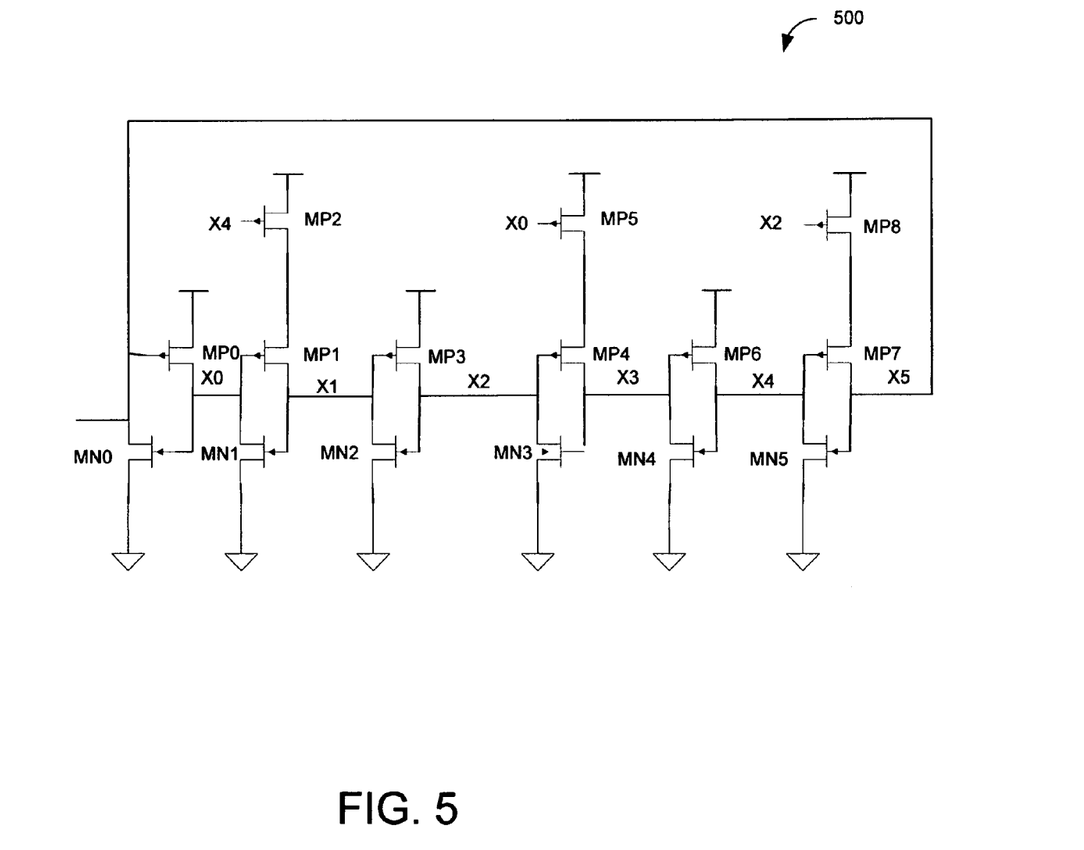
FIG. 5 is a circuit diagram illustrating an embodiment of a triple redundantly interconnected cell (TRICE) using the GICE method according to the principles of the present invention.

FIG. 5 is a circuit diagram illustrating an embodiment of a triple redundantly interconnected cell (TRICE) using the GICE method according to the principles of the present invention. In the TICE described in conjunction with FIG. 1 and the TMICE described in conjunction with FIG. 3, each monostable element 102 includes a P transistor and an N transistor. The TRICE includes a combination of monostable elements and modified monostable elements. The modified monostable elements use logically intertwined states.

The modified monostable element is a monostable element similar to the monostable element 102 described in conjunction with FIG. 1 and FIG. 3, which has been modified to replace either the P transistor or the N transistor with a stack of two or more devices.

Referring to FIG. 5, the storage elements of the TICE shown in FIG. 1, have been modified to include three modified monostable elements and three monostable elements. Each modified monostable element includes an additional P transistor with the gate of each of the additional P transistors coupled to the drain of the other P transistor in the monostable element. This provides a stack of two P transistors in the modified monostable element. The modified monostable element offers an increased measure of fault-tolerance, due to the need for a logical agreement between two signals for example, at node X4 and node X2 in order to transition from the unstable to the stable state.

With six nodes (X0-X5), the TRICE 500 has two coherent states based on the logical values at each node (X0-X5)— 010101 (logical 0) and 101010 (logical 1). In the first coherent state, nodes X0, X2, X4 store logical 0 and nodes X1, X3, X5 store logical 1. Thus, nodes X0-X5 store the value 010101 which represent a logical 0 for the TRICE 500.

In the second coherent state, X0, X2 and X4 store logical 1 and nodes X1, X3 and X5 store logical 0. Thus nodes X0-X5 store logical 101010 which represent a logical 1 for the TRICE 500. Nodes X0, X2, X4 store a logical 0 and nodes X1, X3, X5 store a logical 1.

The TRICE may recover from a transient pulse due to a charged particle strike to any one of the six nodes X0-X5. For example, while in the first coherent state with nodes X0, X2, X4 storing a logical 0, a transient pulse due to a charged particle strike on node X0 results in the logical 0 stored on node X0 transitioning temporarily from a logical 0 to a logical 1.

A logical 1 on node X0 turns off P transistor MP1, and node X1 is held capacitively at logical 1. N transistor MN0 is turned on by the logical 1 on node X0, which results in node X5 being driven to logical 0. A logical 0 on node X5 turns off N transistor MN5, and node X4 is held capacitively at logical 0. As nodes X1, X2, X3 and X4 are not affected by the strike on node X0, node X0 returns to logical 0 when the glitch induced by the strike dissipates. The TRICE may also recover from a charged particle strike to a single node when the TRICE cell stores a logical 1 in the second coherent state.

The TRICE 500 can recover from simultaneous strikes to two nodes storing the same logical value. For example, the TMICE 200 begins in coherent state 1, with nodes X0, X2, X4 storing a logical 0 and nodes X1, X3, X5 storing a logical 1. A transient pulse caused by one or more charged particle strikes to both node X0 and node X2 discharges the stored logical 1 to logical 0 at both node X0 and node X3.

P transistor MP1 is turned on, but P transistor MP2 in the stack remains off because it is driven by node X4 which is unaffected by the strike to node X0 and node X2. N transistor MN2 is shut off as node X2 transitions temporarily to logical 0. Node X1 remains at logical 0 capacitively. N transistor MN0 is also turned off as node X0 transitions temporarily to logical 0. Node X5 remains at logical 0 capacitively.

The strike to node X2 turns on P transistor MP4. Since P transistor MP5 is also turned on due to the strike to node X0, node X3 is driven to logical 1. This turns on N transistor MN3, reinforcing the strike on node X2. P transistor MP6 is turned off, and node X4 remains at logical 1 capacitively. Since node X1, node 4, and node X5 remain unaffected, the logical 1 is restored when the glitch (pulse) due to the strike dissipates. Thus the stacked PMOS configuration shown in FIG. 5 is effective in resisting double node strikes.

Figure 6:
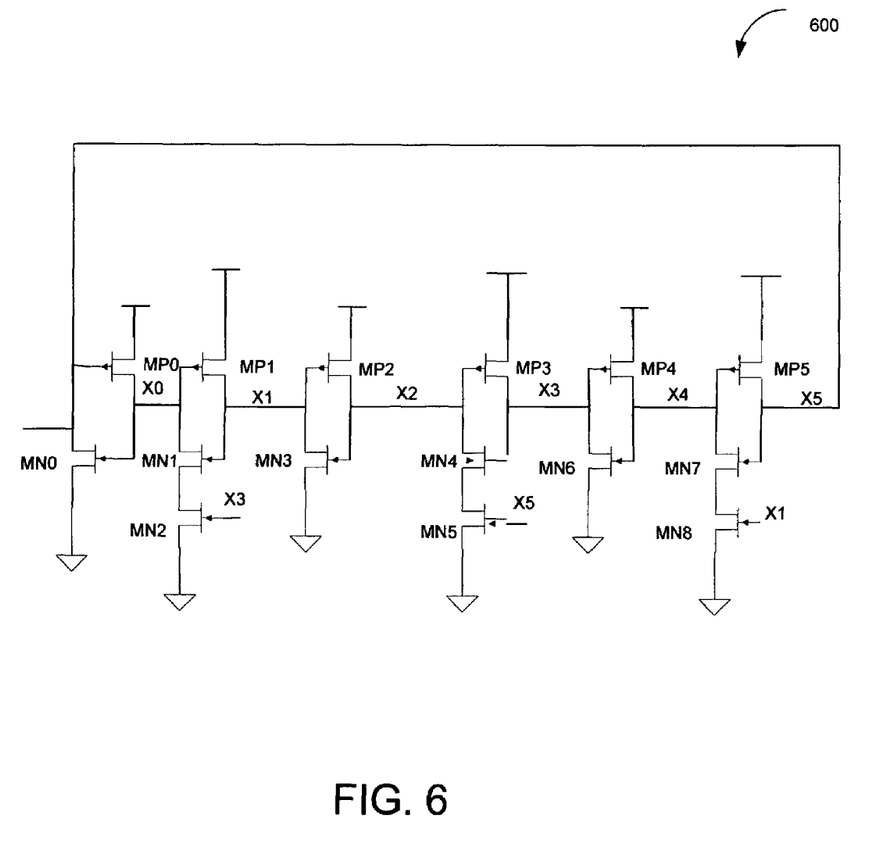
FIG. 6 is a circuit diagram illustrating another embodiment of a triple redundantly interconnected cell (TRICE) using the GICE method according to the principles of the present invention.

FIG. 6 is a circuit diagram illustrating another embodiment of a triple redundantly interconnected cell (TRICE) 600 using the GICE method according to the principles of the present invention.

In the embodiment shown in FIG. 6, a stack for the N type transistors is used instead of the stack for the P type transistors shown in the embodiment in FIG. 5 by coupling the source of another N type transistor to the drain of the N type transistor in the monostable element.

Referring to FIG. 6, the storage elements of the TICE shown in FIG. 1, have been modified to include three modified monostable elements and three monostable elements. Each modified monostable element includes an additional N transistor with the gate of each of the additional N transistors coupled to the drain of the other N transistor in the monostable element. This provides a stack of two N transistors in the modified monostable element. The modified monostable element offers an increased measure of fault-tolerance, due to the need for a logical agreement between two signals e.g., at node X4 and node X2 in order to transition from the unstable to the stable state.

With six nodes (X0-X5), the TRICE 600 has two coherent states based on the logical values at each node (X0-X5)—010101 (logical 0) and 101010 (logical 1). In the first coherent state, nodes X0, X2, X4 store logical 0 and nodes X1, X3, X5 store logical 1. Thus, nodes X0-X5 store the value 010101 which represent a logical 0 for the TRICE 600.

The TRICE 600 shown in FIG. 6 is effective in resisting a single strike in a similar manner to that of the TRICE 500 discussed in conjunction with FIG. 5. The TRICE 600 is also effective in resisting a double strike.

For example, while in the first coherent state with nodes X0, X2, X4 storing a logical 0, a transient pulse due to one or more charged particle strikes to node X0 and node X2 cause node X0 and node X2 to transition temporarily from logical 0 to logical 1. P transistor MP1 is turned off. N transistor MN0 is turned on driving node X5 temporarily to logical 0. This shuts off N transistor MN7. Node X4 remains at logical 0 capacitively, since node X3 is unaffected by the strike.

The strike to node X2 causes transistor MP3 to turn off. Node X3 remains at logical 1 capacitively. Node X2 is restored to logical 0 by N transistor MN4 and N transistor MN5 after the glitch due to the strike dissipates. Also, node X1 is restored to logical 1 by P transistor MP1, and node X5 is restored to logical 1 by node MP5 when the glitch dissipates.

The embodiments of the TRICE shown in FIG. 5 and FIG. 6 provide significant hardening against multiple node charge collections.

Figure 7:
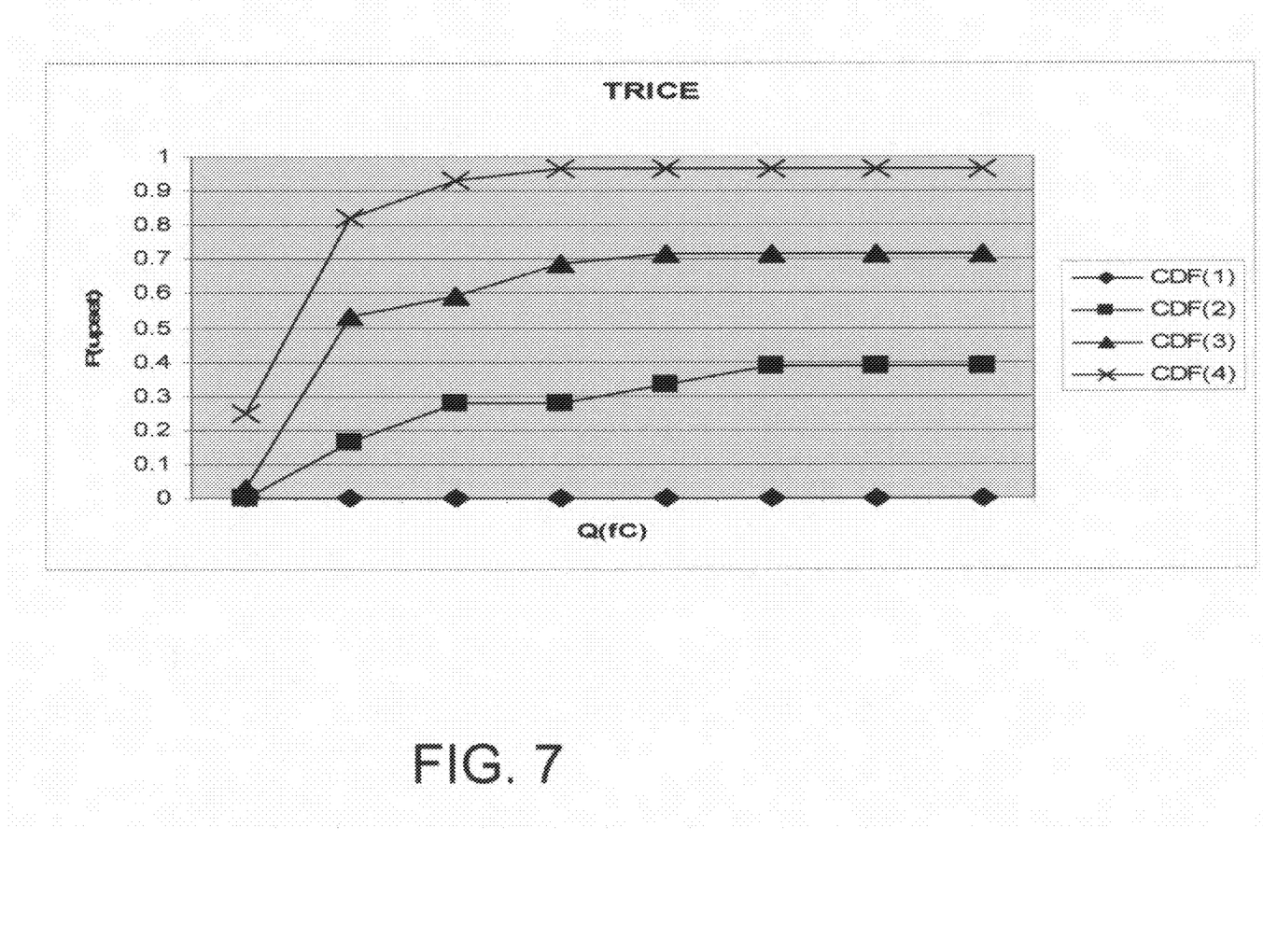
FIG. 7 is a graph illustrating percentage of hits that result in failure based on magnitude of charged particle for a simulation of the TRICE shown in FIG. 5.

FIG. 7 is a graph illustrating percentage of hits that result in failure based on magnitude of charged particles for a simulation of the TRICE shown in FIG. 5.

The X-axis corresponds to the amount of charge (Q) injected into the node(s), that is, the magnitude of the charged particles. The Y-axis corresponds to the percentage of hits that result in failure. The graph provides the results of a SPICE simulation for a charged particle hit for a different magnitude of charge to one, two, three or four nodes in the TRICE circuit. As shown, in the case of a charged particle to one node, the TRICE always recovers irrespective of the magnitude of the charged particle.

As discussed, an embodiment of the TICE described in conjunction with FIG. 1, an embodiment of the TMICE described in conjunction with FIG. 3, and an embodiments of the TRICE described in conjunction with FIGS. 5 and 6, offers improved hardening (decreased sensitivity to charged particle strikes) relative to the DICE. Table 1 below provides a comparison of the transistor count for each circuit.

TABLE 1

| Design | Transistor Count | | |
| --- | --- | --- | --- |
| | Storage | Access | Total |
| DICE | 8 | 4 | 12 |
| TICE | 12 | 6 | 18 |
| TMICE | 18 | 6 | 24 |
| TRICE | 15 | 6 | 21 |

The three types of storage cells, that is, TICE, TMICE, and TRICE allow different levels of redundancy to be provided for different storage elements in a system depending on their criticality and protection by higher level architectures. In other embodiments, the storage cells may also be used to provide energy efficient tolerance to hits in the access nodes.

It will be apparent to those of ordinary skill in the art that methods involved in embodiments of the present invention may be embodied in a computer program product that includes a computer usable medium. For example, such a computer usable medium may consist of a read only memory device, such as a Compact Disk Read Only Memory (CD ROM) disk or conventional ROM devices, or a computer diskette, having a computer readable program code stored thereon.

While embodiments of the invention have been particularly shown and described with references to embodiments thereof, it will be understood by those skilled in the art that various changes in form and details may be made therein without departing from the scope of embodiments of the invention encompassed by the appended claims.

The invention claimed is:

1. An apparatus comprising:
   at least six interlocked monostable elements configured in a loop to provide arbitrary levels of redundancy on at least six nodes, each node to store a logical value, the monostable elements to recover logical values stored on the nodes after a pulse generated by a particle strike to at least one of the nodes that results in a change in logical value has dissipated.

2. The apparatus of claim 1, wherein the number of monostable elements is nine and the number of nodes is six, the monostable elements configured to provide nine different connections between the six nodes.

3. The apparatus of claim 1, wherein the loop is unidirectional.

4. The apparatus of claim 1, wherein the monostable element comprises:
   an n-channel metal-oxide-semiconductor field-effect transistor (N-type) device; and
   a p-channel metal-oxide-semiconductor field-effect transistor (P-type) device, the devices connected in a loop allowing the single stable state to be retained.

5. The apparatus of claim 1, wherein the interlocked monostable elements comprise:
   three first monostable elements, first monostable elements comprising:
     an n-channel metal-oxide-semiconductor field-effect (N-type) device; and
     a p-channel metal-oxide-semiconductor field-effect (P-type) device, the devices connected in a loop allowing the single stable state to be retained; and
   three second monostable elements, the second monostable elements comprising:
     an n-channel metal-oxide-semiconductor field-effect transistor (N-type) device; and
     two p-channel metal-oxide-semiconductor field-effect (P-type) devices, the devices connected in a loop allowing the single stable state to be retained.

6. The apparatus of claim 1, wherein the six interlocked monostable elements comprising:
   three first monostable elements, first monostable elements comprising:
     an n-channel metal-oxide-semiconductor field-effect (N-type) device; and
     a p-channel metal-oxide-semiconductor field-effect (P-type) device, the devices connected in a loop allowing the single stable state to be retained; and
   three second monostable elements, the second monostable elements comprising:
     two n-channel metal-oxide-semiconductor field-effect transistor (N-type) devices; and
     a p-channel metal-oxide-semiconductor field-effect (P-type) device, the devices connected in a loop allowing the single stable state to be retained.

7. The apparatus of claim 1, wherein the pulse generated by the particle strike results from a strike by one or more particles that affect a plurality of nodes that store different logical values.

8. The apparatus of claim 1, wherein a charge generated by the particle strike results from a strike by one or more particles that affect a plurality of nodes that store the same logical value.

9. A method comprising:
   configuring at least six interlocked monostable elements in a loop to provide arbitrary levels of redundancy on at least six nodes;
   storing a logical value on each node; and
   recovering by the monostable elements the logical values stored on the nodes after a pulse generated by a particle strike to at least one of the nodes which results in a change in logical value has dissipated.

10. The method of claim 9, wherein the number of monostable elements is nine and the number of nodes is six, the monostable elements configured to provide nine different connections between the six nodes.

11. The method of claim 9, wherein the loop is unidirectional.

12. The method of claim 9, wherein the monostable element comprises:
   an n-channel metal-oxide-semiconductor field-effect transistor (N-type) device; and
   a p-channel metal-oxide-semiconductor field-effect transistor (P-type) device, the devices connected in a loop allowing the single stable state to be retained.

13. The method of claim 9, wherein the charge generated by the particle results from a strike by one or more particles that affect a plurality of nodes that store different logical values.

14. The method of claim 9, wherein the charge generated by the particle results from a strike by one or more particles that affect a plurality of nodes that store the same logical value.

* * * * *